United States Patent
Eaglesham

(10) Patent No.: US 8,525,021 B2
(45) Date of Patent: Sep. 3, 2013

(54) PHOTOVOLTAIC DEVICES INCLUDING HETEROJUNCTIONS

(75) Inventor: David Eaglesham, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 239 days.

(21) Appl. No.: 12/236,759

(22) Filed: Sep. 24, 2008

(65) Prior Publication Data

US 2009/0211637 A1    Aug. 27, 2009

Related U.S. Application Data

(60) Provisional application No. 60/974,981, filed on Sep. 25, 2007.

(51) Int. Cl.
*H01L 31/00* (2006.01)

(52) U.S. Cl.
USPC ........... 136/260; 136/252; 136/262; 136/264; 136/265; 136/255; 438/85; 438/95; 438/94; 438/627

(58) Field of Classification Search
USPC ............... 136/260, 252, 262, 264, 265, 255; 438/85, 95, 94, 627
See application file for complete search history.

(56) References Cited

U.S. PATENT DOCUMENTS

| | | | |
|---|---|---|---|
| 4,039,357 A | 8/1977 | Bachmann et al. | |
| 5,279,678 A * | 1/1994 | Jordan et al. | 136/244 |
| 5,286,306 A * | 2/1994 | Menezes | 136/249 |
| 5,474,939 A * | 12/1995 | Pollock et al. | 438/85 |
| 5,501,744 A | 3/1996 | Albright | |
| 6,040,521 A * | 3/2000 | Kushiya et al. | 136/265 |
| 6,057,561 A | 5/2000 | Kawasaki et al. | |
| 6,852,614 B1 * | 2/2005 | Compaan et al. | 438/603 |
| 2004/0200523 A1* | 10/2004 | King et al. | 136/262 |
| 2005/0098204 A1* | 5/2005 | Roscheisen et al. | 136/263 |
| 2006/0180200 A1* | 8/2006 | Platzer Bjorkman et al. | 136/265 |
| 2006/0233211 A1* | 10/2006 | Edmond et al. | 372/43.01 |
| 2007/0029558 A1* | 2/2007 | Nishizono | 257/96 |
| 2007/0131276 A1* | 6/2007 | Nee | 136/256 |
| 2007/0152236 A1 | 7/2007 | Halpert et al. | |

OTHER PUBLICATIONS

Afzaal, et al., Recent developments in II-IV and III-VI semiconductors and their applications in solar cells, J. Mater. Chem., vol. 16, pp. 1597-1602 (2006).
International Preliminary Report on Patentability, Mar. 30, 2010, WIPO.

\* cited by examiner

*Primary Examiner* — Xiuyu Tai
(74) *Attorney, Agent, or Firm* — Dickstein Shapiro LLP

(57) ABSTRACT

A photovoltaic cell can include a heterojunction between semiconductor layers. The first semiconductor layer can include a III-V compound semiconductor, the first semiconductor layer positioned over a transparent conductive layer. A second semiconductor layer can include a II-VI compound semiconductor, the second semiconductor layer positioned between the first semiconductor layer and a back metal contact.

8 Claims, 1 Drawing Sheet

PHOTOVOLTAIC DEVICES INCLUDING HETEROJUNCTIONS

CLAIM FOR PRIORITY

This application claims priority under 35 U.S.C. §119(e) to Provisional U.S. Patent Application Ser. No. 60/974,981 filed on Sep. 25, 2007, which is hereby incorporated by reference.

TECHNICAL FIELD

This invention relates to photovoltaic devices.

BACKGROUND

During the fabrication of photovoltaic devices, layers of semiconductor material can be applied to a substrate with one layer serving as a window layer and a second layer serving as the absorber layer. The window layer can allow the penetration of solar radiation to the absorber layer, where the optical power is converted into electrical power. Some photovoltaic devices can use transparent thin films that are also conductors of electrical charge. The conductive thin films can include transparent conductive layers that contain a transparent conductive oxide (TCO), such as fluorine-doped tin oxide, aluminum-doped zinc oxide, or indium tin oxide. The TCO can allow light to pass through a semiconductor window layer to the active light absorbing material and also serve as an ohmic contact to transport photogenerated charge carriers away from the light absorbing material. A back electrode can be formed on the back surface of a semiconductor layer. The back electrode can include electrically conductive material, such as metallic silver, nickel, copper, aluminum, titanium, palladium, chrome, molybdenum or any practical combination thereof.

SUMMARY

In general, a photovoltaic device can include a transparent conductive layer on a substrate, a first semiconductor layer including a III-V compound semiconductor, the first semiconductor layer positioned over the transparent conductive layer, and a second semiconductor layer including a II-VI compound semiconductor, the second semiconductor layer positioned between a first semiconductor layer and a back metal contact. The II-VI compound and the III-V compound can form a heterojunction.

A photovoltaic device can further include an interfacial layer that enhances the rectifying properties of the junction between the III-V and II-VI compound semiconductors. The II-VI compound can be a cadmium telluride. The II-VI compound can be an alloy or doped composition of cadmium telluride. The III-V compound can be a gallium nitride. The III-V compound can be an alloy or doped composition of gallium nitride. The gallium nitride can be a gallium aluminum nitride. The interfacial layer can include an oxide or doped compositions thereof. The oxide can be a doped tin oxide. The doped tin oxide can be a zinc-doped tin oxide. The doped tin oxide can be a cadmium-doped tin oxide. The oxide can be a doped zinc oxide. The oxide can be a cadmium zinc oxide, for example.

A method of manufacturing a photovoltaic device can include depositing a first semiconductor layer on a substrate, the first semiconductor layer including a III-V compound semiconductor and depositing a second semiconductor layer between the first semiconductor layer and a back metal contact, the second semiconductor layer including a II-VI compound semiconductor. The method can further include depositing an interfacial layer between the first semiconductor layer and the second semiconductor layer to enhance a rectifying junction between the III-V and II-VI compound semiconductors.

A system for generating electrical energy can include a multilayered photovoltaic cell including a transparent conductive layer on a substrate, a first semiconductor layer including a III-V compound semiconductor, the first semiconductor layer positioned over the transparent conductive layer, a second semiconductor layer including a II-VI compound semiconductor, the second semiconductor layer positioned between a first semiconductor layer and a back metal contact, and a first electrical connection connected to a transparent conductive layer, and a second electrical connection connected to a back metal electrode adjacent to a second semiconductor layer. A system can further include an interfacial layer that enhances the rectifying junction between the III-V and II-VI compound semiconductors.

The details of one or more embodiments are set forth in the accompanying drawings and the description below. Other features, objects, and advantages will be apparent from the description and drawings, and from the claims.

DETAILED DESCRIPTION

Figure 1:
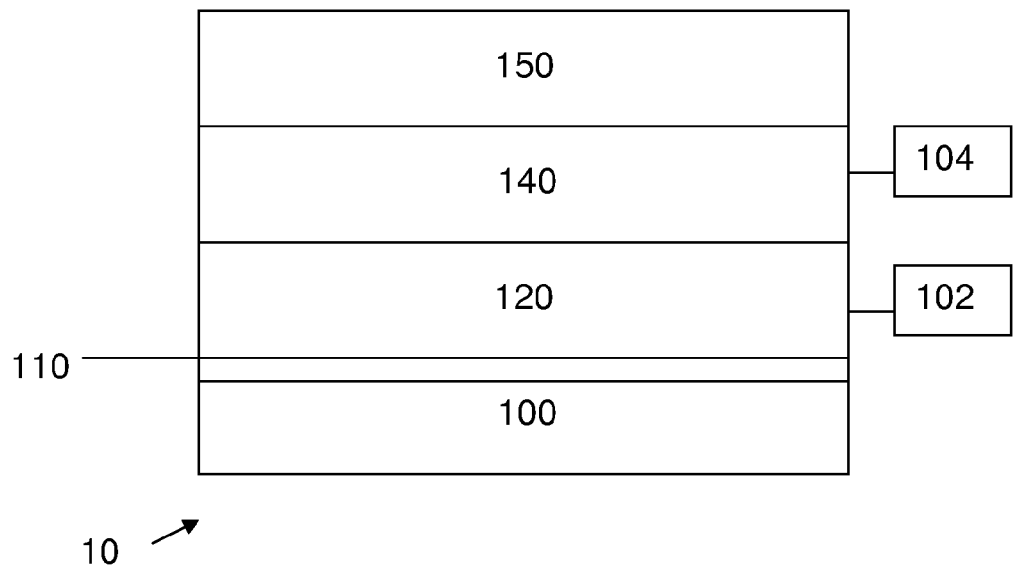
FIG. 1 is a schematic of a photovoltaic device having multiple layers.

Photovoltaic devices can include a rectifying junction between p-type or high resistivity CdTe and doped or undoped n-type CdS. The n-type CdS can be covered with a high resistivity buffer layer that may contain doped or undoped transparent oxides such as $SnO_2$, $SiO_2$, $SnO_2$:Cd, $SnO_2$:Zn or $CdZnO_2$.

In certain circumstances, an interfacial layer can be in contact with a semiconductor layer including CdTe. The valence band maximum (VBM) of CdTe is about 5.74 eV below the vacuum level, however, and no metals with such high work functions are currently known. In the past, researchers have employed an interfacial layer between the semiconductor layer and the back metal contact layer intended to enable hole transport by tunneling into the metal electrode.

Both rectifying and low resistance junctions with a semiconductor layer, such as a semiconductor layer including a CdTe, may include thin film interfacial layers designed to improve electrical performance of the devices. Interfacial layers can include, for example, oxides between the CdTe and metal electrode of the photovoltaic device. Interfacial layers can be deposited by wet chemistry, sputter etching and sputter deposition, e-beam evaporation followed by thermal annealing, chemical bath deposition, atomic layer deposition method and other methods known to those in the art.

A CdS layer can be a wide bandgap n-type heterojunction partner to CdTe layer. However, a thick CdS layer absorbs photons equivalent to approximately 6 $mA/cm^2$ out of approximately 30 $mA/cm^2$ that could be absorbed by the CdTe. Thus, researchers have found that it can be advantageous to use a thin CdS layer to pass light with energy above the CdS bandgap. The lower limit on CdS layer thickness can be due to the requirement that the heterojunction partner contain sufficient charge to balance the negative space charge in the CdTe. An n-type junction to CdTe can therefore typically contain a second high resistivity n-type buffer layer on the side of the CdS layer opposite to the CdTe layer. An n-type dopant for a CdTe surface can include, for example, B, Al, Ga, In, Tl, F, Cl, Br, or I. The high resistivity buffer layer can both add to the positive space charge and mitigate effects of shunts through the CdS film. Such buffer layers, are described, for example in U.S. Pat. No. 5,279,678, which is incorporated by reference in its entirety.

Previous rectifying heterojunctions including CdTe have been produced with compounds consisting of at least one element from column VIA of the periodic table, e.g. the chalcogenides. Similarly, photovoltaic devices have been produced with a variety of heterojunctions composed of one element from each of columns IIIA and VA of the periodic table, known as III-V compounds. Yet, researchers have not formed junctions between II-VI and III-V materials.

In contrast to previous devices and methods, the claimed devices and methods incorporate innovative combinations of semiconductors and employs device architectures that overcome limitations on existing device structures and enable enhanced photovoltaic device performance.

Referring to FIG. 1, a photovoltaic device 10 can include a transparent conductive layer 110 on a substrate 100, a first semiconductor layer 120, the first semiconductor layer including a III-V compound semiconductor 102, the first semiconductor layer positioned over the transparent conductive layer, and a second semiconductor layer 140, the second semiconductor layer including a II-VI compound semiconductor 104, the second semiconductor layer positioned between a first semiconductor layer and a back metal contact 150.

Figure 2:
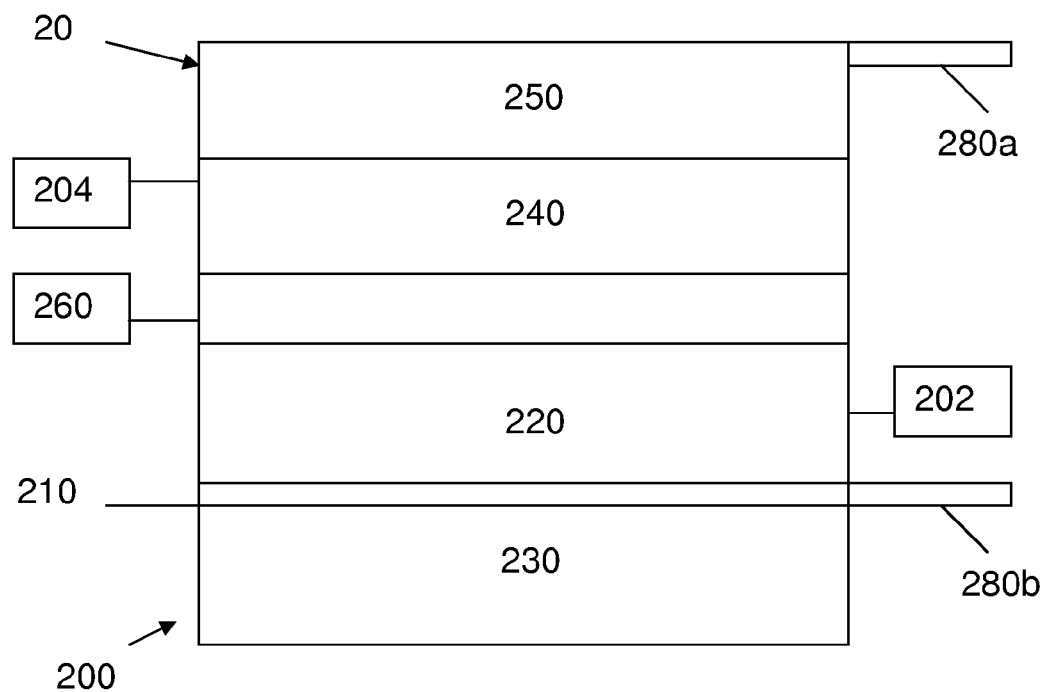
FIG. 2 is a schematic of a system for generating electrical energy.

Referring to FIG. 2, a system 200 for generating electrical energy can include a multilayered photovoltaic cell 20 including a transparent conductive layer 210 on a substrate 230, a first semiconductor layer 220, the first semiconductor layer including a III-V compound semiconductor 202, the first semiconductor layer positioned over the transparent conductive layer, a second semiconductor layer 240, the second semiconductor layer including a II-VI compound semiconductor 204, the second semiconductor layer positioned between a first semiconductor layer and a back metal contact 250, and a first electrical connection 280b connected to a transparent conductive layer, and a second electrical connection 280a connected to a back metal electrode adjacent to a second semiconductor layer. A system can further include an interfacial layer 260 that enhances a rectifying junction between the III-V and II-VI compound semiconductors.

A first semiconductor layer can include a III-V compound or alloys thereof. A III-V compound can be a material with a chemical formula XY, wherein X is selected from a group including boron, aluminum, gallium, indium, and thallium, and Y is selected from a group including nitrogen, phosphorus, arsenic, antimony, and bismuth. A III-V compound can be a gallium nitride, for example. The gallium nitride can be a gallium aluminum nitride.

A first semiconductor layer can include a wide bandgap semiconductor. A second semiconductor layer can include a II-VI compound or alloys thereof. A II-VI compound can be a material with a chemical formula X'Y', wherein X' is selected from a group including zinc, cadmium, and mercury, and Y' is selected from a group including oxygen, sulfur, selenium, tellurium, and polonium. A II-VI compound can be a cadmium telluride, for example.

A heterojunction can be formed between the II-VI compound and the III-V compound. An interfacial layer can enhance a rectifying junction, such as a rectifying heterojunction between a II-VI compound and a III-V compound. An interfacial layer can include an oxide or doped compositions thereof. The oxide can be a zinc oxide, for example. The oxide can be a mercury oxide. The oxide can be a tin oxide. The oxide can be a doped tin oxide. The doped tin oxide can be a zinc-doped tin oxide. The doped tin oxide can be a cadmium-doped tin oxide. The oxide can be a doped zinc oxide. The oxide can be a cadmium zinc oxide, copper oxide, iron oxide, magnesium oxide, nickel oxide, palladium oxide, silver oxide, strontium oxide, titanium oxide, vanadium oxide, for example.

An interfacial layer can be positioned between a first semiconductor layer and a second semiconductor layer to form a rectifying junction between the III-V and II-VI compound semiconductors.

An interfacial layer can be positioned on either side of a semiconductor layer or on both sides of a semiconductor layer. A semiconductor layer can include CdTe for example. Low resistance hole transport between a semiconductor layer and a metal contact or a semiconductor layer and another semiconductor layer can be achieved by using high work function materials.

A method of manufacturing a photovoltaic device can include depositing a first semiconductor layer on a substrate, the first semiconductor layer including a III-V compound semiconductor and depositing a second semiconductor layer between the first semiconductor layer and a back metal contact, the second semiconductor layer including a II-VI compound semiconductor. The method can further include depositing an interfacial layer between the first semiconductor layer and the second semiconductor layer to enhance a rectifying junction between the III-V and II-VI compound semiconductors.

A system for generating electrical energy can include a multilayered photovoltaic cell including a transparent conductive layer on a substrate, a first semiconductor layer including a III-V compound semiconductor, the first semiconductor layer positioned over the transparent conductive layer, a second semiconductor layer including a II-VI compound semiconductor, the second semiconductor layer positioned between a first semiconductor layer and a back metal contact, and a first electrical connection connected to a transparent conductive layer and a second electrical connection connected to a back metal electrode adjacent to a second semiconductor layer. A system can further include an interfacial layer that enhances a rectifying junction between the III-V and II-VI compound semiconductors.

Photovoltaic devices can include a rectifying junction between p-type or high resistivity CdTe and doped or undoped n-type CdS. The n-type CdS can be covered with a high resistivity buffer layer that may contain doped or undoped transparent oxides such as $SnO_2$, $SiO_2$, $SnO_2$:Cd, $SnO_2$:Zn or $CdZnO_2$. Previous attempts at constructing junctions between CdTe and various II-VI n-type semiconductors have not achieved commercially viable performance. Likewise, previous attempts at constructing junctions between CdTe to p-type materials including such as $Cu_2Te$ and ZnTe have not achieved commercially viable performance.

In certain circumstances, an interfacial layer can be in contact with a semiconductor layer including CdTe. The valence band maximum (VBM) of CdTe is about 5.74 eV below the vacuum level, however, and no metals with such high work functions are currently known. An interfacial layer between the semiconductor layer and the back metal contact layer can enable hole transport by tunneling into the metal electrode.

Previous attempts to treat the surfaces of a semiconductor layers typically required heavy doping with copper. For example a semiconductor could be positioned adjacent to a copper-doped ZnTe film. Alternatively, an undoped ZnTe film could be positioned adjacent to a CdTe layer and a second degenerately copper-doped ZnTe film could be positioned the opposite side of the undoped ZnTe film. With previous methods, it was unclear what role was played by the matching the VBM of the CdTe and ZnTe films and what role was played by the copper dopant. Previous methods have not included the use of high work function p-type TCOs to treat semiconductor layers, in part due to the difficulty in producing p-type TCOs with sufficiently high electrical conduction and optical transparency to play the role of n-type TCOs in other semiconductor devices. Semiconductors with a bandgap greater than CdTe and which match the VBM of CdTe also serve to reflect electrons within the CdTe from the CdTe-wide bandgap interface.

The interfaces between a first semiconductor layer and a second semiconductor layer, or between a semiconductor layer and a metal layer, can have significant impact on device performance. For example, interfaces may provide electrical defects that produce mid-gap energy levels to promote the recombination of electrons from the conduction band with holes from the valence band. Recombination of electrons and holes can be a loss mechanism for photovoltaic devices. Negative impacts of interfaces on device performance can be mitigated by several ways, such as careful selection of heterojunction partners to minimize the lattice mismatch between the two materials, grading material composition from one heterojunction material to the other, and passivating the interface with oxygen, sulfur, hydrogen or other materials to tie up dangling bonds responsible for the mid-gap energy states.

Amphiphilic molecules can also be used at the interfaces to alter electrical performance by creating a dipole layer on surfaces or at interfaces. Furthermore, even in the absence of lattice mismatch, the symmetry of a crystal lattice can be distorted by the existence of an interface between two materials of different electrical properties such that dipole layers form at the interface due to differences in the nature of chemical bonding between atoms of the heterojunction partners.

Both rectifying and low resistance junctions with a semiconductor layer, such as a semiconductor layer including a CdTe, may include thin film interfacial layers designed to improve electrical performance of the devices. Interfacial layers can include, for example, oxides between the CdTe and metal electrode of the photovoltaic device. Interfacial layer can be by wet chemistry, sputter etching and sputter deposition, e-beam evaporation followed by thermal annealing, chemical bath deposition, or atomic layer deposition method.

Previous devices employ a conventional CdS layer as a wide bandgap n-type heterojunction partner to CdTe layer. However, a thick CdS layer absorbs photons equivalent to approximately 6 mA/cm$^2$ out of approximately 30 mA/cm$^2$ that could be absorbed by the CdTe. Thus, it can be advantageous to use a thin CdS layer to pass light with energy above the CdS bandgap. The lower limit on CdS layer thickness can be due to the requirement that the heterojunction partner contain sufficient charge to balance the negative space charge in the CdTe. An n-type junction to CdTe can therefore contain a second high resistivity n-type buffer layer on the side of the CdS layer opposite to the CdTe layer. The high resistivity buffer layer can both add to the positive space charge and mitigate effects of shunts through the CdS film. Such buffer layers, are described, for example in U.S. Pat. No. 5,279,678, which is incorporated by reference in its entirety.

Previous rectifying heterojunctions including CdTe have been produced with compounds consisting of at least one element from column VIA of the periodic table, e.g. the chalcogenides. Similarly, photovoltaic devices have been produced with a variety of heterojunctions composed of one element from each of columns IIIA and VA of the periodic table, known as III-V compounds. Yet, researchers have not formed junctions between II-VI and III-V materials.

An improved photovoltaic device can include an interfacial layer that accounts for the chemical potential of a semiconductor, such as Cd, at the interface between a semiconductor layer, such as a CdTe layer, and a high work function or wide bandgap semiconductor. Whereas the previous devices specifically attempted to induce a p$^+$ region in the vicinity of the p-type electrode or hole collector either by heavy doping or by lowering the chemical potential of Cd, an improved photovoltaic device can specifically maintain a high chemical potential of a semiconductor, such as Cd, to minimize formation of Cd vacancies and its associated defect complexes. Low resistance transport of holes between the semiconductor layer, such as a CdTe layer and a back metal electrode can be achieved using a high work function or wide bandgap semiconductor in an interfacial layer between the semiconductor layer and the back metal electrode.

A photovoltaic cell can have multiple layers. The multiple layers can include a bottom layer that can be a transparent conductive layer, a capping layer, a window layer, an absorber layer and a top layer. Each layer can be deposited at a different deposition station of a manufacturing line with a separate deposition gas supply and a vacuum-sealed deposition chamber at each station as required. The substrate can be transferred from deposition station to deposition station via a rolling conveyor until all of the desired layers are deposited. Additional layers can be added using other techniques such as sputtering. Electrical conductors can be connected to the top and the bottom layers respectively to collect the electrical energy produced when solar energy is incident onto the absorber layer. A top substrate layer can be placed on top of the top layer to form a sandwich and complete the photovoltaic cell.

The bottom layer can be a transparent conductive layer, and can be, for example, a transparent conductive oxide such as tin oxide or tin oxide doped with fluorine. Deposition of a semiconductor layer at high temperature directly on the transparent conductive oxide layer can result in reactions that negatively impact of the performance and stability of the photovoltaic device. Deposition of a capping layer of material with a high chemical stability (such as silicon dioxide, dialuminum trioxide, titanium dioxide, diboron trioxide and other similar entities) can significantly reduce the impact of these reactions on device performance and stability. The thickness of the capping layer should be minimized because of the high resistivity of the material used. Otherwise a resistive block counter to the desired current flow may occur. A capping layer can reduce the surface roughness of the transparent conductive oxide layer by filling in irregularities in the surface, which can aid in deposition of the window layer and can allow the window layer to have a thinner cross-section. The reduced surface roughness can help improve the uniformity of the window layer. Other advantages of including the capping layer in photovoltaic cells can include improving optical clarity, improving consistency in band gap, providing better field strength at the junction and providing better device efficiency as measured by open circuit voltage loss. Capping layers are described, for example, in U.S. Patent Publication 20050257824, which is incorporated by reference in its entirety.

The window layer and the absorbing layer can include, for example, a binary semiconductor such as group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. An example of a window layer and absorbing layer can be a layer of CdS coated by a layer of CdTe. A top layer can cover the semiconductor layers. The top layer can include a metal such as, for example, aluminum, molybdenum, nickel, titanium, tungsten, or alloys thereof.

Deposition of semiconductor layers in the manufacture of photovoltaic devices is described, for example, in U.S. Pat. Nos. 5,248,349, 5,372,646, 5,470,397, 5,536,333, 5,945,163, 6,037,241, and 6,444,043, each of which is incorporated by reference in its entirety. The deposition can involve transport of vapor from a source to a substrate, or sublimation of a solid in a closed system. An apparatus for manufacturing photovoltaic cells can include a conveyor, for example a roll conveyor with rollers. Other types of conveyors are possible. The conveyor transports substrate into a series of one or more deposition stations for depositing layers of material on the exposed surface of the substrate. Conveyors are described in provisional U.S. application Ser. No. 11/692,667, which is incorporated by reference in its entirety.

The deposition chamber can be heated to reach a processing temperature of not less than about 450° C. and not more than about 700° C., for example the temperature can range from 450-550° C., 550-650° C., 570-600° C., 600-640° C. or any other range greater than 450° C. and less than about 700° C. The deposition chamber includes a deposition distributor connected to a deposition vapor supply. The distributor can be connected to multiple vapor supplies for deposition of various layers or the substrate can be moved through multiple and various deposition stations with its own vapor distributor and supply. The distributor can be in the form of a spray nozzle with varying nozzle geometries to facilitate uniform distribution of the vapor supply.

The bottom layer of a photovoltaic cell can be a transparent conductive layer. A thin capping layer can be on top of and at least covering the transparent conductive layer in part. The next layer deposited is the first semiconductor layer, which can serve as a window layer and can be thinner based on the use of a transparent conductive layer and the capping layer. The next layer deposited is the second semiconductor layer, which serves as the absorber layer. Other layers, such as layers including dopants, can be deposited or otherwise placed on the substrate throughout the manufacturing process as needed.

The transparent conductive layer can be a transparent conductive oxide, such as a metallic oxide like tin oxide, which can be doped with, for example, fluorine. This layer can be deposited between the front contact and the first semiconductor layer, and can have a resistivity sufficiently high to reduce the effects of pinholes in the first semiconductor layer. Pinholes in the first semiconductor layer can result in shunt formation between the second semiconductor layer and the first contact resulting in a drain on the local field surrounding the pinhole. A small increase in the resistance of this pathway can dramatically reduce the area affected by the shunt.

A capping layer can be provided to supply this increase in resistance. The capping layer can be a very thin layer of a material with high chemical stability. The capping layer can have higher transparency than a comparable thickness of semiconductor material having the same thickness. Examples of materials that are suitable for use as a capping layer include silicon dioxide, dialuminum trioxide, titanium dioxide, diboron trioxide and other similar entities. Capping layer can also serve to isolate the transparent conductive layer electrically and chemically from the first semiconductor layer preventing reactions that occur at high temperature that can negatively impact performance and stability. The capping layer can also provide a conductive surface that can be more suitable for accepting deposition of the first semiconductor layer. For example, the capping layer can provide a surface with decreased surface roughness.

The first semiconductor layer can serve as a window layer for the second semiconductor layer. The first semiconductor layer can be thinner than the second semiconductor layer. By being thinner, the first semiconductor layer can allow greater penetration of the shorter wavelengths of the incident light to the second semiconductor layer.

The first semiconductor layer can be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof. It can be a binary semiconductor, for example it can be CdS. The second semiconductor layer can be deposited onto the first semiconductor layer. The second semiconductor can serve as an absorber layer for the incident light when the first semiconductor layer is serving as a window layer. Similar to the first semiconductor layer, the second semiconductor layer can also be a group II-VI, III-V or IV semiconductor, such as, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, or mixtures thereof.

A number of embodiments have been described. Nevertheless, it will be understood that various modifications may be made without departing from the spirit and scope of the invention. For example, the semiconductor layers can include a variety of other materials, as can the materials used for the buffer layer and the capping layer. In addition, the device may contain interfacial layers between a second semiconductor layer and a back metal electrode to reduce resistive losses and recombination losses at the interface between the second semiconductor and the back metal electrode. Accordingly, other embodiments are within the scope of the following claims.

What is claimed is:

1. A photovoltaic device comprising:
   a transparent conductive layer on a substrate;
   a first semiconductor layer including an n-type III-V compound semiconductor, the first semiconductor layer positioned over the transparent conductive layer;
   a second semiconductor layer including a p-type II-VI compound semiconductor, the second semiconductor layer positioned between the first semiconductor layer and a back metal contact, wherein a rectifying heterojunction is formed between the III-V and II-VI compound semiconductors; and
   an interfacial layer between the first semiconductor layer and the second semiconductor layer that enhances the rectifying heterojunction between the III-V and II-VI compound semiconductors, wherein the interfacial layer includes cadmium zinc oxide.

2. The device of claim 1, wherein the II-VI compound is a cadmium telluride.

3. The device of claim 1, wherein the III-V compound is a gallium nitride.

4. The device of claim 3, wherein the gallium nitride is a gallium aluminum nitride.

5. The device of claim 1, wherein the first semiconductor layer is a window layer of the device and the second semiconductor layer is an absorber layer of the device.

6. A system for generating electrical energy comprising:
a multilayered photovoltaic cell including:
- a transparent conductive layer on a substrate,
- a first semiconductor layer including an n-type III-V compound semiconductor, the first semiconductor layer positioned over the transparent conductive layer,
- a second semiconductor layer including a p-type II-VI compound semiconductor, the second semiconductor layer positioned between the first semiconductor layer and a back metal electrode, wherein a rectifying heterojunction is formed between the III-V and II-VI compound semiconductors, and
- an interfacial layer that enhances the rectifying heterojunction between the III-V and II-VI compound semiconductors, wherein the interfacial layer includes cadmium zinc oxide;
a first electrical connection connected to the transparent conductive layer; and
a second electrical connection connected to the back metal electrode, the back metal electrode being adjacent to the second semiconductor layer.

7. The system of claim 6, wherein the II-VI compound is a cadmium telluride and the III-V compound is a gallium nitride.

8. The system of claim 6, wherein the first semiconductor layer is a window layer of the device and the second semiconductor layer is an absorber layer of the device.

* * * * *